United States Patent
Chun

(10) Patent No.: US 6,291,259 B1
(45) Date of Patent: Sep. 18, 2001

(54) STACKABLE BALL GRID ARRAY SEMICONDUCTOR PACKAGE AND FABRICATION METHOD THEREOF

(75) Inventor: Dong Seok Chun, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/239,152

(22) Filed: Jan. 28, 1999

(30) Foreign Application Priority Data

May 30, 1998 (KR) .................................................. 98-20098

(51) Int. Cl.[7] .................................................. H01L 21/44
(52) U.S. Cl. .................... 438/106; 438/106; 438/107; 438/108; 438/109; 257/678; 257/685
(58) Field of Search .................................. 438/106–109; 257/678, 685

(56) References Cited

U.S. PATENT DOCUMENTS

| | | | |
|---|---|---|---|
| 5,045,921 | * 9/1991 | Lin et al. | 357/74 |
| 5,477,611 | 12/1995 | Sweis et al. | 29/840 |
| 5,625,221 | * 4/1997 | Kim et al. | 257/686 |
| 5,776,796 | * 7/1998 | Distefano et al. | 438/106 |
| 5,793,118 | * 8/1998 | Nakajima | 257/790 |
| 5,930,598 | * 7/1999 | Wille et al. | 438/108 |
| 5,933,709 | * 8/1999 | Chun | 438/122 |
| 5,950,072 | * 9/1999 | Queyssac | 438/118 |
| 5,977,640 | * 6/1998 | Bertin et al. | 257/777 |
| 6,020,637 | * 2/2000 | Karnezor | 257/738 |
| 6,025,258 | * 2/2000 | Ochiai et al. | 438/613 |
| 6,028,365 | * 2/2000 | Akram et al. | 257/778 |
| 6,051,890 | * 4/2000 | Mozdzen | 257/784 |
| 6,054,337 | * 4/2000 | Solberg | 438/107 |
| 6,072,233 | * 6/2000 | Corisis et al. | 257/686 |
| 6,117,705 | * 9/2000 | Glenn et al. | 438/106 |

* cited by examiner

Primary Examiner—Matthew Smith
Assistant Examiner—Granvill D Lee, Jr.
(74) Attorney, Agent, or Firm—Fleshner & Kim, LLP

(57) ABSTRACT

A stackable Ball Grid Array (BGA) semiconductor chip package and a fabrication method thereof increases reliability and mount density of a semiconductor package. The stackable BGA semiconductor chip package includes a supporting member that includes a supporting plate and a supporting frame formed on edges of the supporting plate. Conductive patterns are formed in and extend through the supporting member. First metal traces are formed on a bottom of the supporting plate and the first metal traces are connected to first ends of the conductive patterns in the supporting member. Second metal traces are attached to an upper surface of a semiconductor chip, and the semiconductor chip is attached to the supporting member. The second metal traces are connected to bond pads of the chip, and to upper ends of the conductive patterns in the supporting member. A plurality of conductive balls are then attached to exposed portions of the first and/or the second metal traces.

20 Claims, 5 Drawing Sheets

STACKABLE BALL GRID ARRAY SEMICONDUCTOR PACKAGE AND FABRICATION METHOD THEREOF

BACKGROUND OF THE INVENTION

1. Field of the Invention

The present invention relates to a stackable ball grid array (BGA) semiconductor package and a fabrication method thereof.

2. Background of the Related Art

Currently, there is an effort to produce a highly integrated semiconductor package having a large number of exterior connections. One example is a BGA semiconductor package in which a plurality of solder balls which are attached to a substrate are used as external terminals. In these BGA packages, a plurality of solder balls are attached to an upper or a lower surface of a substrate by the application of heat. The solder balls, which act as external terminals, are not easily bent or deformed by inpacts with solid objects.

FIG. 1 shows a structure of a background art BGA semiconductor package. As seen in FIG. 1, an elastomer 2 is attached to a center portion of an upper surface of a semiconductor chip 1, and a high strength adhesive resin 3 is formed on the elastomer 2. A plurality of metal traces, which transmit electric signals, are formed on the adhesive resin 3. First ends 4a of the metal traces extend across a top surface of the adhesive resin 3, and second ends 4b of each of the metal traces are connected to chip pads 6 formed on a marginal portion of the upper surface of the semiconductor chip 1. A solder resist 5 covers the metal traces 4a and the adhesive resin 3, except for exposed portions of the first ends 4a of the metal traces, onto which solder balls will be attached. An encapsulant 7, such as a molding resin, covers the upper surface of the semiconductor chip 1, and the portions of the metal traces that are not covered with the solder resist 5. Conductive balls 8 are then attached to the exposed portions of the metal traces to serve as output terminals.

Since the conductive balls are exposed on only one side of the package (in FIG. 1, the conductive balls are exposed at the upper surface thereof), it is impossible to fabricate a stackable package of high mount density.

SUMMARY OF THE INVENTION

It is an object of the present invention to provide a stackable BGA semiconductor package, and a fabrication method thereof, that maintain advantages of the conventional BGA package.

A stackable chip package embodying the invention includes a supporting member having a plurality of conductive patterns formed therein. A plurality of first conductive traces are formed on a surface of the supporting member, and respective ones of the first conductive traces are coupled to corresponding ones of the conductive patterns. A chip having chip pads is attached to a second surface of the supporting member, and a plurality of second conductive traces are arranged over the chip. Respective ones of the second conductive traces are electrically coupled to corresponding chip pads on the chip, and corresponding ones of the conductive patterns in the supporting member. An embodiment of the invention could also include a solder resist that covers selected portions of the first and second conductive traces. The solder resist would leave connecting portions of the first and second conductive traces exposed. Exterior leads, in the form of conductive balls, could then be connected to the connecting portions of the first and second conductive traces. A device embodying the invention could also include a molding resin that encapsulates portions of the conductive traces and the chip. The supporting member could include a supporting plate and a supporting frame that surrounds the supporting plate.

In a method embodying the invention, a supporting member having a plurality of conductive patterns is first formed. A plurality of first conductive traces are then formed on a first surface of the supporting member such that the conductive traces are electrically coupled to corresponding ones of the conductive patterns in the supporting member. A plurality of second traces are then attached to a surface of a chip, and the chip is attached to a second surface of the supporting member. Respective ones of the second conductive traces are attached to corresponding chip pads on the chip, and to corresponding ones of the conductive patterns in the supporting member. A method embodying the invention could also include the step of forming layers of solder resist over the first and second conductive traces, and removing portions of the solder resist to expose connecting portions of the first and second conductive traces. A method embodying the invention could also include attaching leads, in the form of conductive balls, to respective ones of the exposed connecting portions of the first and second conductive traces.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The accompanying drawings illustrate embodiments of the invention and together with the description serve to explain the principles of the invention. In the drawing figures, like elements are identified with like reference numerals, and.

DETAILED DESCRIPTION OF PREFERRED EMBODIMENTS

Figure 1:
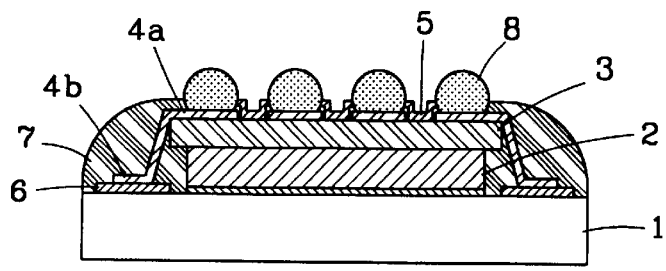
FIG. 1 is a vertical cross-sectional diagram of a background art BGA semiconductor package.
Figure 2:
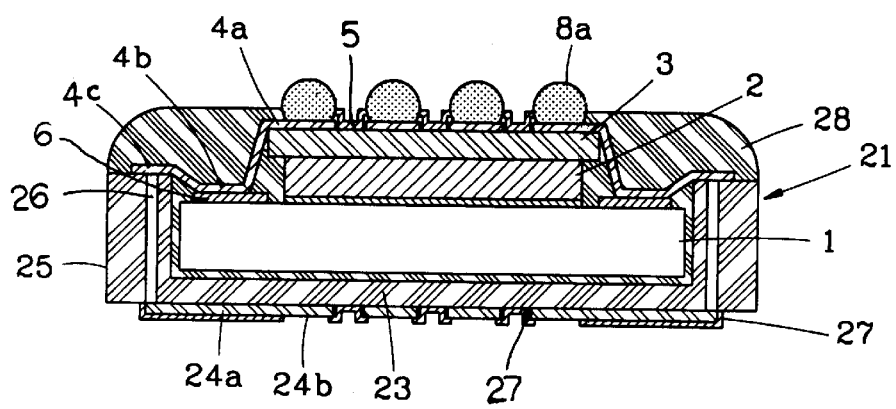
FIG. 2 is a vertical cross-sectional diagram of a stackable BGA semiconductor package according to a first embodiment of the present invention.

FIG. 2 illustrates a stackable BGA semiconductor package according to a first embodiment of the present invention. As shown in FIG. 2, a supporting member 21 includes a supporting plate 23 surrounded by a supporting frame 25 having a predetermined height. Metal traces 24a are attached to a lower surface of the supporting plate 23. In addition, a solder resist 27 covers portions of the metal traces 24a and the supporting plate 23 to prevent short circuiting between solder balls and the metal traces, and to protect the metal traces 24a from outside impacts. The solder resist 27 is partially removed to expose portions of the metal traces 24a. The exposed portions of the metal traces 24a act as connecting portions 24b. The connecting portions 24b are used to electrically connect the metal traces 24a to conductive balls that act as external terminals.

Metal patterns 26 are formed between upper and lower surfaces of the supporting frame 25. One end of each of the metal patterns 26 is connected with an end of each of the metal traces 24a. The other end of each of the metal patterns 26 is exposed at the upper surface of the supporting frame 25.

A semiconductor chip 1 is attached by an adhesive onto the supporting plate 23 of the supporting member 21. An elastomer 2 is attached to a center portion of the upper surface of the semiconductor chip 1, and a high strength adhesive resin 3 is formed on the elastomer 2. Metal traces which transmit electric signals are attached onto the adhesive resin 3. First ends 4a of the metal traces extend over the top surface of the adhesive resin. Middle portions 4b of the metal traces are connected with chip pads 6 formed on a marginal portion of the upper surface of the semiconductor chip 1. Second ends 4c of the metal traces are connected with upper surfaces of the metal patterns 26 formed in the supporting frame 25.

A solder resist 5 covers the upper surface of the adhesive resin 3 and portions of the first ends 4a of the metal traces. Conductive balls 8a are attached to the exposed portions of the first ends 4a of the metal traces. An encapsulant 28, such as a molding resin, covers exposed portions of the upper surface of the semiconductor chip 1, the metal traces, and the upper portion of the supporting frame 25.

Electrical signals which are output by the semiconductor chip 1 through the chip pads 6 can be externally transmitted over the conductive balls 8a connected with the first ends 4a of the metal traces. The electrical signals can also be externally transmitted through the connecting portions 24b on the lower part of the supporting member 21, which are connected to the second ends 4c of the metal traces through the metal patterns 26.

Figure 3:
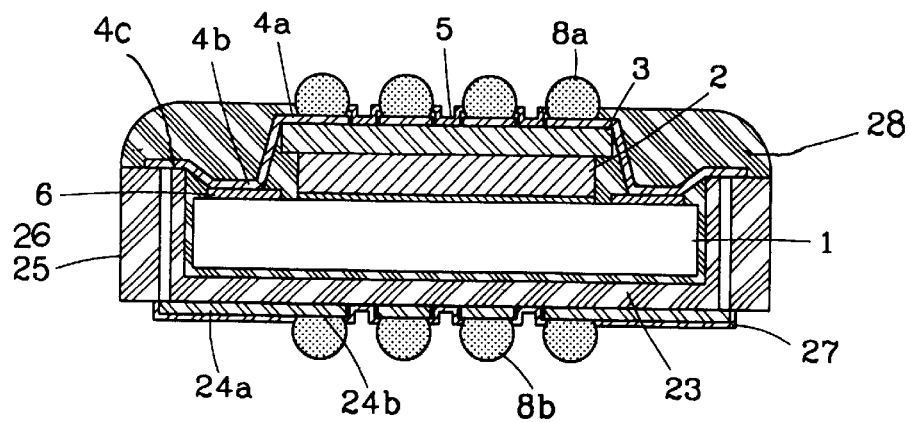
FIG. 3 is a vertical cross-sectional diagram of a stackable BGA semiconductor package according to a second embodiment of the present invention.

FIG. 3 is a vertical cross-sectional diagram of a stackable BGA semiconductor package according to a second embodiment of the present invention. The second embodiment is the same as the embodiment shown in FIG. 2, except that conductive balls 8b are also attached to the exposed portions 24b, of the metal traces 24a formed on the lower part of the supporting member 21.

With each of the embodiments shown in FIGS. 2 and 3, it becomes possible to stack a plurality of BGA semiconductor packages over a single mounting position on a printed circuit board. Thus, the density of the semiconductor devices on a circuit board can be increased by using BGA packages embodying the invention.

Figure 4:
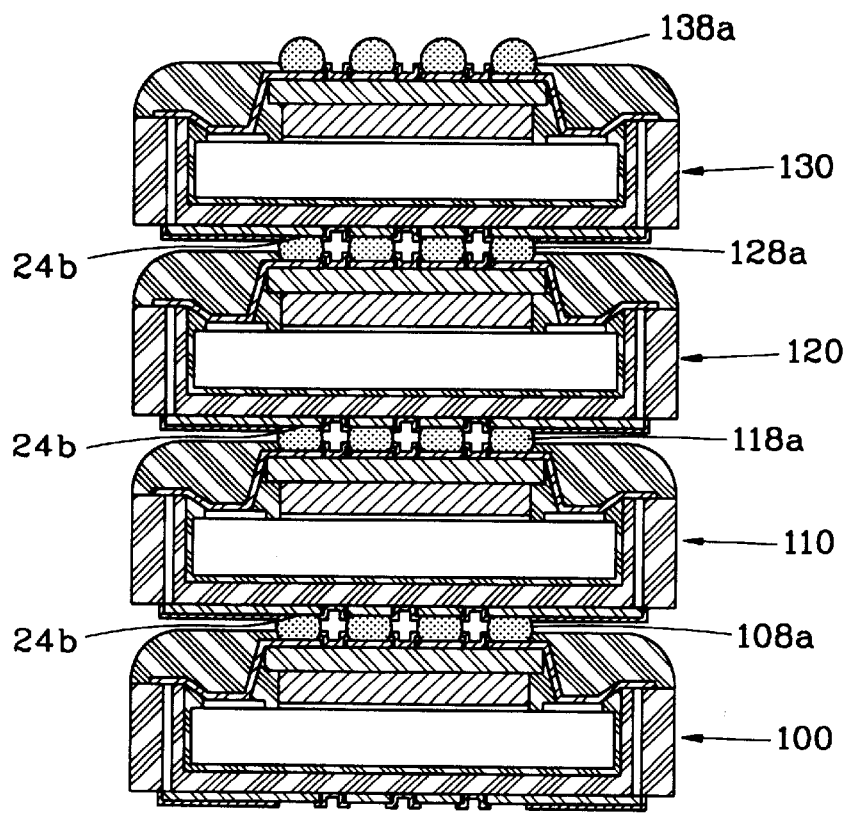
FIG. 4 is a vertical cross-sectional diagram of stacked BGA semiconductor packages according to the present invention.

FIG. 4 illustrates stacked BGA semiconductor packages using the stackable BGA semiconductor package according to the first embodiment of the present invention shown in FIG. 2. As shown therein, a plurality of stackable BGA semiconductor packages 100, 110, 120, 130 are stacked. Conductive balls 108a, which are formed on an upper surface of the first package 100, connect the first ends 4a of the metal traces on the first package 100 to the connecting portions 24b formed on a lower surface of the second BGA semiconductor package 110. Conductive balls 118a formed on an upper surface of the second package 110 connect the first ends 4a of the metal traces on the second package 110 to the connecting portions 24b on a lower surface of the third BGA semiconductor package 120. Conductive balls 128a formed on an upper surface of the third package 120 connect the first ends 4a of the metal traces on the third package 120 to the connecting portions 24b on a lower surface of the fourth package 130.

FIG. 4 illustrates four stacked BGA packages, but the actual number of stacked BGA packages may be variously adjusted by a user according to his requirements. Conductive balls 138a formed on the fourth package 130 can serve as external terminals which transmit signals from all the BGA packages to external circuits. For instance, the conductive balls 138a could be connected to pads of a printed circuit board.

A method of fabricating a stackable BGA semiconductor chip package according to the present invention will now be described with reference to FIGS. 5A–5H.

Figure 5A:
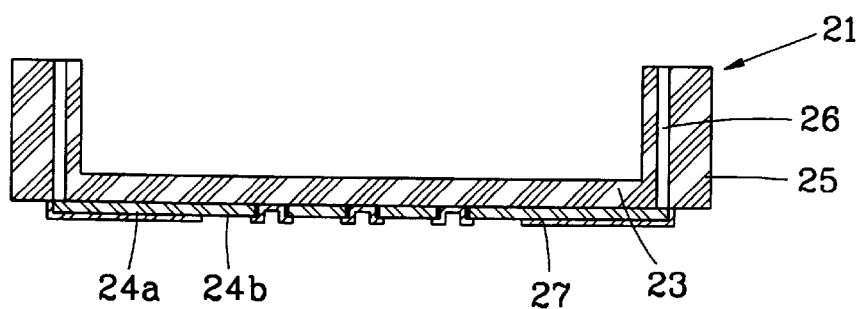
FIGS. 5A through 5H illustrate steps of a method of manufacturing a stackable BGA semiconductor package according to the present invention.

In FIG. 5A, first the supporting member 21 is provided. The supporting member 21, includes the supporting plate 23 and the supporting frame 25. Metal traces 24a are formed on a lower surface of the supporting plate 23. The solder resist 27 covers portions of the metal traces 24a, but leaves the connecting portions 24b exposed. The metal patterns 26 formed in the supporting frame 25, are exposed at the upper surface of the supporting frame 25, and are connected with the metal traces 24a on the bottom of the supporting plate 23.

Figure 5B:
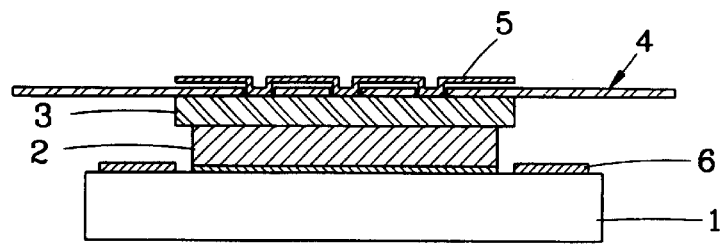

As shown in FIG. 5B, the semiconductor chip 1, which has chip pads 6 on a marginal portion of an upper surface thereof, is connected to a lower surface of an elastomer 2. A high strength adhesive 3 is attached to an upper surface of the elastomer 2. The metal traces are then attached to the upper surface of the adhesive 3. First end portions of each of the metal traces are attached to the adhesive 3, and the other end portions thereof extend from outer sides of the adhesive 3. Next, a layer of the solder resist 5 is formed on the metal traces and on the adhesive resin 3.

Figure 5C:
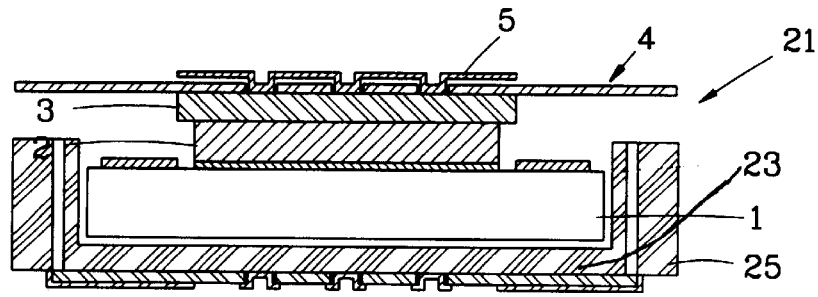

Next, as shown in FIG. 5C, the semiconductor chip assembly shown in FIG. 5B is attached to the supporting member 21 shown in FIG. 5A.

Figure 5D:
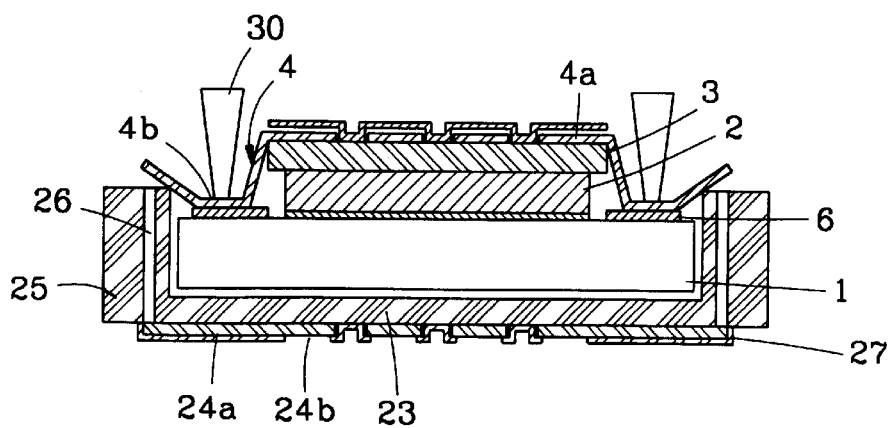

In FIG. 5D, using a bond tool 30, the chip pads 6 formed on the semiconductor chip 1 are connected to the middle portions 4b of the metal traces by pressing down the middle portions 4b.

Figure 5E:
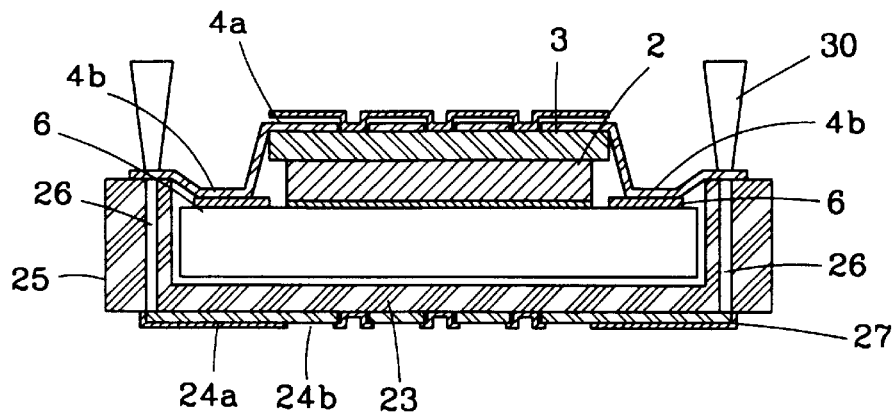

As shown in FIG. 5E, second ends 4c of the metal traces are cut off by the bond tool 30, and the second ends 4c are connected with upper surfaces of the metal patterns 26 in the supporting frame 25.

Figure 5F:
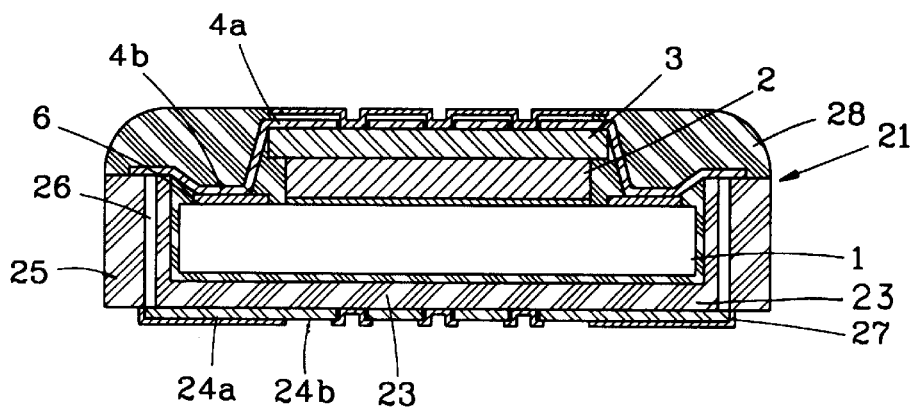
Figure 5G:
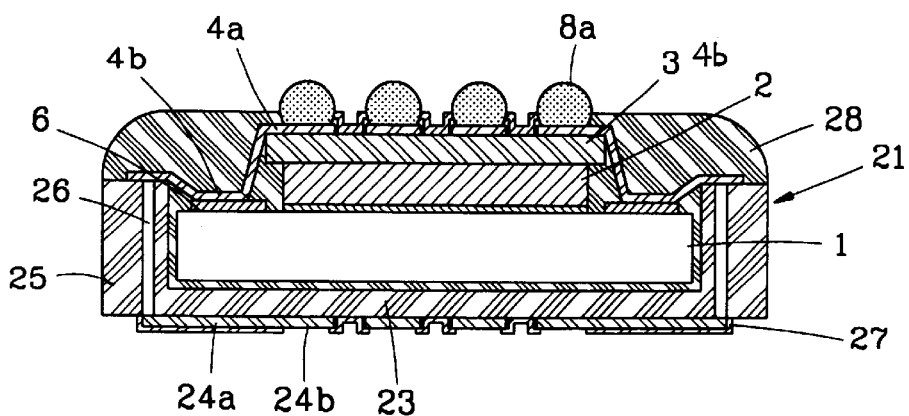
Figure 5H:
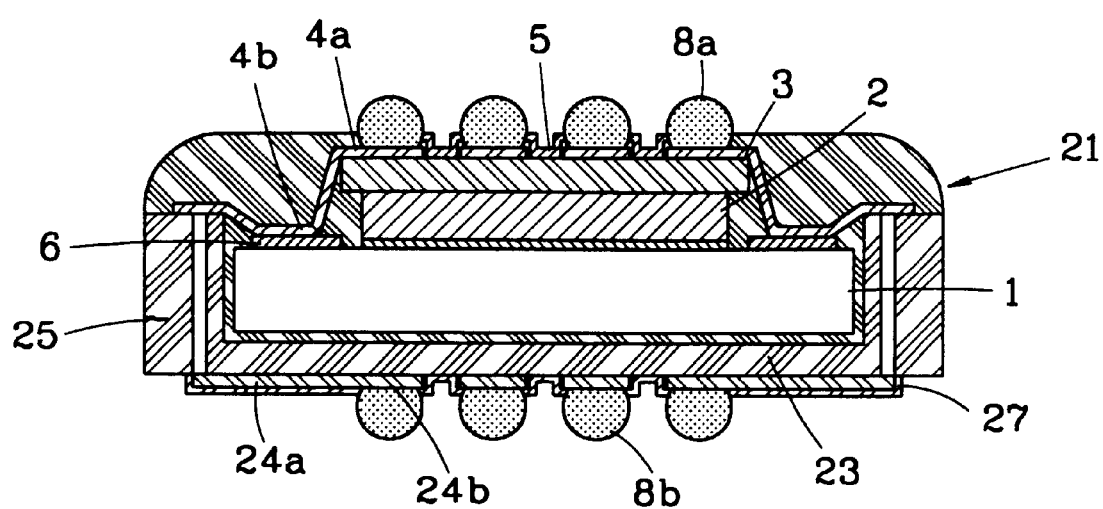

As shown in FIG. 5F and 5G, a molding resin 28 is molded over the package so that it covers the exposed portions of the metal traces and the exposed portions of the chip 1 and chip pads 6. Next, portions of the solder resist 5 formed on the metal traces is removed to expose portions of the first ends 4a of the metal traces that will be connected to conductive balls.

As shown in FIG. 5G, the conductive balls 8a are then placed on the exposed portions of the first ends 4a of the metal traces, and a reflow process is performed to attach the conductive balls 8a to the metal traces.

One BGA package embodying the invention can be attached to a second BGA package embodying the invention by stacking the second package on the first package so that conductive balls on the first package align with corresponding connecting portions on a bottom surface of the second package, and then performing a reflow process to connect the two packages.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although metal traces and a conductive region in a semiconductor may not be structural equivalents in that metal traces use metal as an electrical conductor, whereas the conductive region in a semiconductor relies on charge carriers in the material to provide electrical conductivity, in the environment of conducting electricity, metal traces and a conductive region of a semiconductor may be equivalent structures.

What is claimed is:

1. A method of fabricating a stackable chip package, comprising:

forming a supporting member having a plurality of conductive patterns therein;

forming a plurality of first conductive traces on a first surface of the supporting member such that respective ones of the first conductive traces are electrically coupled to corresponding ones of the conductive patterns;

attaching a plurality of second conductive traces to a first surface of a chip wherein connecting portions of the second conductive traces are located over the first surface of the chip;

attaching a second surface of the chip to a second surface of the supporting member such that connecting portions of the first conductive traces are located below the second surface of chip;

attaching respective ones of the second conductive traces to corresponding chip pads of the chip; and attaching respective ones of the second conductive traces to corresponding ones of the conductive patterns in the supporting member.

2. The method of claim 1, further comprising the steps of:

forming a layer of solder resist over the plurality of first conductive traces and the first surface of the supporting member; and removing portions of the solder resist to expose the connecting portions of the first conductive traces.

3. The method of claim 1, further comprising the steps of:

forming a layer of solder resist over the plurality of second conductive traces; and removing portions of the solder resist to expose the connecting portions of the second conductive traces.

4. The method of claim 3, further comprising the step of attaching a plurality of conductive members configured to act as leads to respective ones of the exposed connecting portions of the second conductive traces.

5. The method of claim 4, wherein the step of attaching a plurality of conductive members to respective ones of the exposed connecting portions of the second conductive traces comprises the steps of:

placing a plurality of conductive members on respective ones of the connecting portions of the second conductive traces; and conducting a reflow process to attach the conductive members to the second conductive traces.

6. The method of claim 1, wherein the step of forming a supporting member comprises forming a supporting member having a supporting plate surrounded by a supporting frame, and wherein the conductive patterns are formed in the supporting frame.

7. The method of claim 1, further comprising the step of covering portions of the second conductive traces and portions of the chip with a molding resin.

8. The method of claim 1, wherein the step of attaching a plurality of second conductive traces to a chip comprises the steps of:

attaching an elastomer to a surface of the chip;

attaching an adhesive to an exposed surface of the elastomer; and attaching the plurality of second conductive traces to the adhesive.

9. The method of claim 1, wherein the step of attaching respective ones of the second conductive traces to corresponding chip pads of the chip comprises pressing respective ones of the second conductive traces into contact with corresponding chip pads with a bonding tool.

10. The method of claim 1, wherein the step of attaching a plurality of second conductive traces to a first surface of a chip comprises:

attaching a plurality of second conductive traces to an elastomer member; and attaching the elastomer member to the first surface of the chip.

11. A method of fabricating a stackable chip package, comprising:

forming a supporting member having a plurality of conductive patterns therein;

forming a plurality of first conductive traces on a lead bearing member;

attaching the lead bearing member onto a first surface of a chip;

attaching a second surface of the chip to a first surface of the supporting member;

coupling respective ones of the first conductive traces to corresponding chip pads of the chip and to corresponding conductive patterns in the supporting member; and forming a plurality of second conductive traces on a second surface of the supporting member such that respective ones of the second conductive traces are coupled to corresponding ones of the conductive patterns in the supporting member.

12. The method of claim 11, wherein the step of forming the plurality of second conductive traces comprises forming the second conductive traces such that connecting portions of the second conductive traces are located below the second surface of the chip.

13. The method of claim 11, wherein the step of forming a plurality of first conductive traces on a lead bearing member and the step of attaching the lead bearing member to the first surface of the chip are performed such that connecting portions of the first conductive traces are located over the first surface of the chip.

14. The method of claim 13, wherein the step of forming the plurality of second conductive traces comprises forming the second conductive traces such that connecting portions of the second conductive traces are located below the second surface of the chip.

15. The method of claim 14, wherein the step of forming the plurality of second conductive traces is performed such that when two of the stackable chip packages are stacked, the connecting portions of the second conductive traces of the upper chip package are aligned with the connecting portions of the first conductive traces of the lower chip package.

16. The method of claim 14, wherein the step of forming a plurality of first conductive traces on a lead bearing member comprises:

attaching an adhesive resin layer to a first surface of an elastomer; and attaching the plurality of first conductive traces to the adhesive resin layer.

17. The method of claim 16, wherein the elastomer and adhesive resin form the lead bearing member, and wherein the step of attaching the lead bearing member onto a first surface of a chip comprises attaching a second surface of the elastomer to the first surface of the chip.

18. The method of claim 11, further comprising:

forming a layer of solder resist over the plurality of first conductive traces; and removing portions of the solder resist to expose the connecting portions of the first conductive traces.

19. The method of claim 11, wherein the step of coupling respective ones of the first conductive traces to corresponding chip pads of the chip comprises pressing respective ones of the first conductive traces into contact with corresponding chip pads with a bonding tool.

20. A method of fabricating a stackable chip package, comprising:

forming a supporting member having a plurality of conductive patterns therein;

attaching a first surface of a chip onto a first surface of the supporting member;

forming a plurality of first conductive traces over a second surface of the chip such that connecting portions of the first conductive traces are located over the second surface of the chip;

coupling respective ones of the first conductive traces to corresponding chip pads of the chip and to corresponding conductive patterns in the supporting member; and forming a plurality of second conductive traces on a second surface of the supporting member such that respective ones of the second conductive traces are coupled to corresponding ones of the conductive patterns in the supporting member, and such that connecting portions of the second conductive traces are located below the first surface of the chip.

* * * * *